(12) United States Patent
Lee et al.

(10) Patent No.: US 12,110,587 B2
(45) Date of Patent: Oct. 8, 2024

(54) DEPOSITION APPARATUS AND METHOD WITH EM RADIATION

(71) Applicant: Taiwan Semiconductor Manufacturing Co., Ltd., Hsinchu (TW)

(72) Inventors: Tze-Liang Lee, Hsinchu (TW); Po-Hsien Cheng, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 17/674,977

(22) Filed: Feb. 18, 2022

(65) Prior Publication Data

US 2023/0151489 A1 May 18, 2023

Related U.S. Application Data

(60) Provisional application No. 63/278,581, filed on Nov. 12, 2021.

(51) Int. Cl.
*H01J 37/32* (2006.01)
*C23C 16/455* (2006.01)

(52) U.S. Cl.
CPC .. *C23C 16/45536* (2013.01); *C23C 16/45565* (2013.01); *H01J 37/32211* (2013.01); *H01J 37/3244* (2013.01); *H01J 37/32522* (2013.01); *H01J 37/32532* (2013.01); *H01J 2237/2002* (2013.01); *H01J 2237/332* (2013.01)

(58) Field of Classification Search
None
See application file for complete search history.

(56) References Cited

U.S. PATENT DOCUMENTS

| 5,441,569 A | * | 8/1995 | Veligdan | C23C 16/06 |
| | | | | 118/723 MP |
| 9,738,977 B1 | * | 8/2017 | Karim | C23C 16/45574 |
| 2008/0008640 A1 | * | 1/2008 | Watanabe | H01L 21/0262 |
| | | | | 257/E31.05 |
| 2010/0081260 A1 | * | 4/2010 | Chen | C23C 16/325 |
| | | | | 257/E21.09 |
| 2018/0076028 A1 | * | 3/2018 | Swaminathan | H01L 21/02274 |

(Continued)

FOREIGN PATENT DOCUMENTS

| EP | 521615 A2 * | 1/1993 | ........... C23C 16/483 |
| JP | 2004146734 A * | 5/2004 | |

(Continued)

*Primary Examiner* — David P Turocy
(74) *Attorney, Agent, or Firm* — Slater Matsil, LLP

(57) ABSTRACT

A deposition apparatus and a method are provided. A method includes placing a substrate over a platform in a chamber of a deposition system. A precursor material is introduced into the chamber. A first gas curtain is generated in front of a first electromagnetic (EM) radiation source coupled to the chamber. A plasma is generated from the precursor material in the chamber, wherein the plasma comprises dissociated components of the precursor material. The plasma is subjected to a first EM radiation from the first EM radiation source. The first EM radiation further dissociates the precursor material. A layer is deposited over the substrate. The layer includes a reaction product of the dissociated components of the precursor material.

19 Claims, 15 Drawing Sheets

(56) References Cited

U.S. PATENT DOCUMENTS

2021/0115557 A1  4/2021  Ko et al.
2021/0193454 A1  6/2021  Ko et al.

FOREIGN PATENT DOCUMENTS

| KR | 20100008052 A | * | 1/2010 |
|----|---------------|---|--------|
| TW | 201728780 A   |   | 8/2017 |
| TW | 201824961 A   |   | 7/2018 |
| TW | 202012675 A   |   | 4/2020 |
| TW | 202117960 A   |   | 5/2021 |
| TW | 202125598 A   |   | 7/2021 |
| TW | 202140839 A   |   | 11/2021 |

* cited by examiner

DEPOSITION APPARATUS AND METHOD WITH EM RADIATION

PRIORITY CLAIM AND CROSS-REFERENCE

This application claims the benefit of U.S. Provisional Application No. 63/278,581, filed on Nov. 12, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
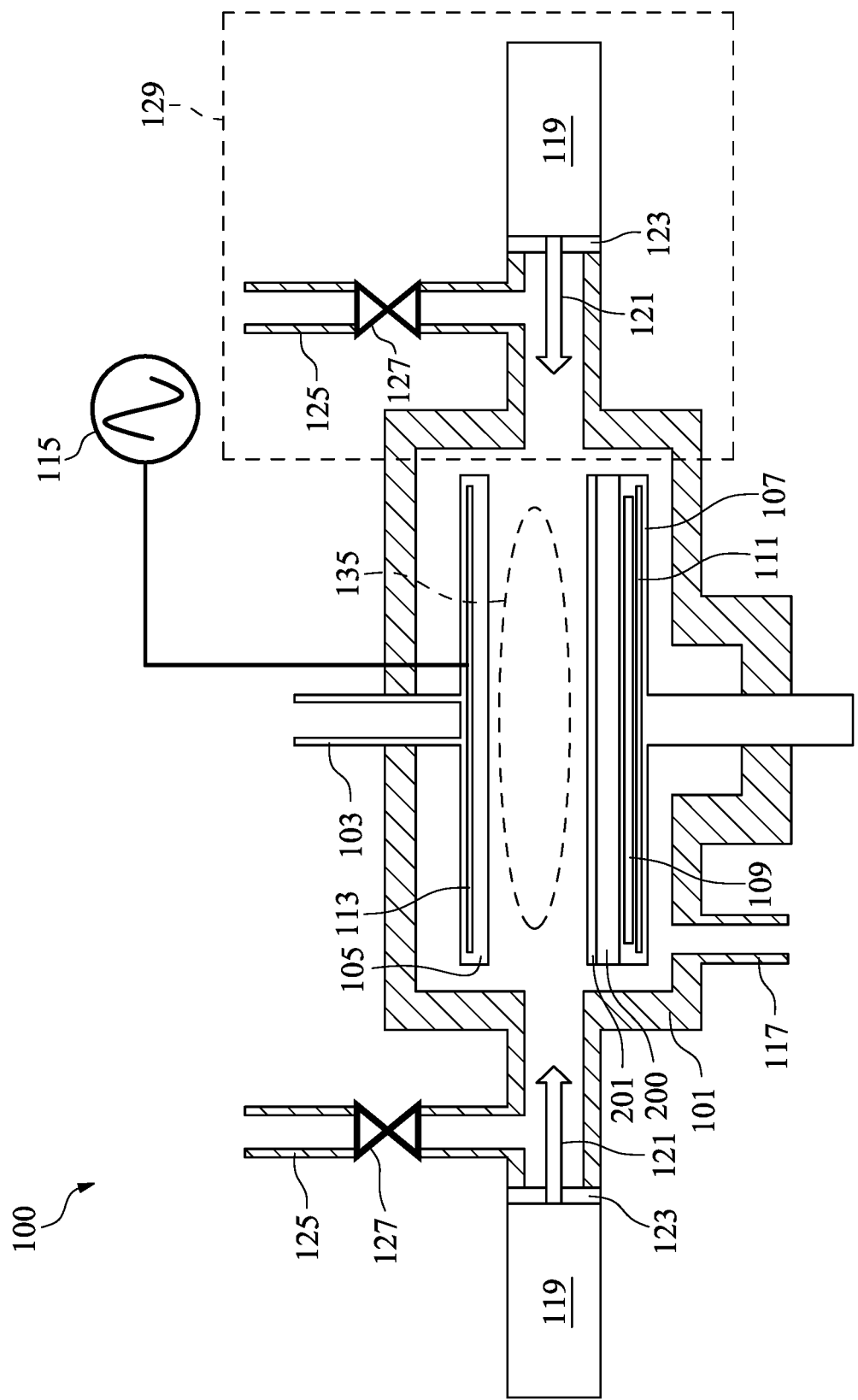
FIGS. 1A and 1B illustrate cross-sectional views of a deposition system in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, a deposition apparatus and method. In some embodiments, a deposition apparatus comprises one or more electromagnetic (EM) radiation sources, such as an ultraviolet (UV) source or a laser source, that dissociate, heat and/or excite precursor material within a chamber of the deposition apparatus. In some embodiments, one or more EM radiation sources are used to burn cluster defects formed in a layer deposited over a substrate and reduce defect levels within the deposited layer. Various embodiments discussed herein allow for depositing void-free and seam free layers with reduced impurity and defect levels, and providing additional parameters (such as, for example, EM radiation intensity and/or wavelength) for tuning the deposition process (for example, tuning a composition of the deposited layer).

Figure 1B:
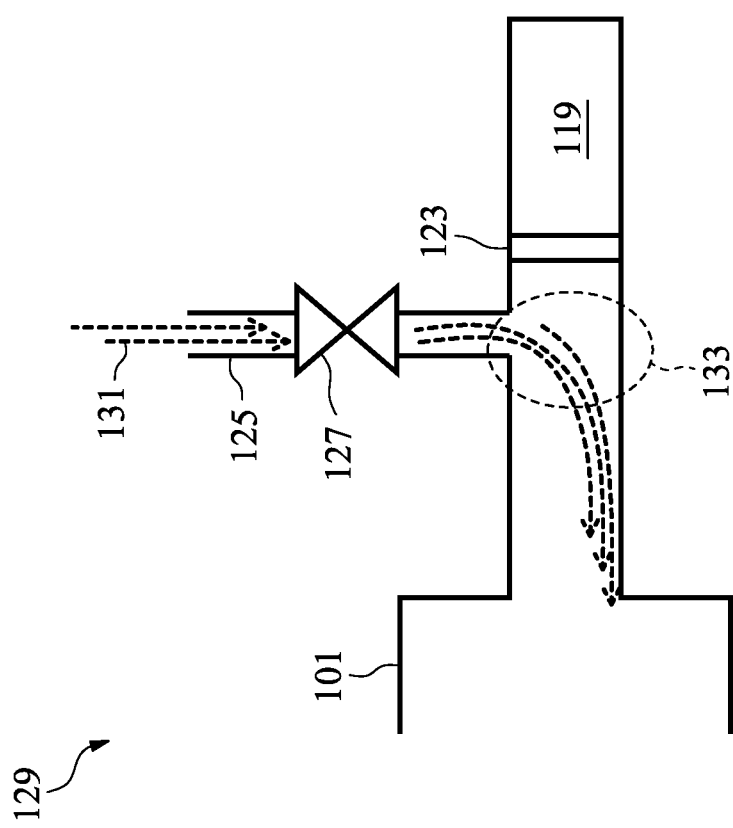

FIGS. 1A and 1B illustrate a deposition system 100 in accordance with some embodiments. FIG. 1A illustrates a cross-sectional view in accordance with some embodiments. FIG. 1B illustrates a detailed view of a region 129 of the deposition system 100 (see FIG. 1A) in accordance with some embodiments. The deposition system 100 may be utilized to deposit a deposited layer 201 over a substrate 200, which may be, for example, a semiconductor structure, a wafer, a device, a package, another structure, or the like.

As described below in greater detail, the deposition system 100 may perform a deposition process, such that thermal energy, plasma energy, and/or EM radiation energy (such as UV or laser energy) provide deposition energy during the deposition process. In some embodiments when the deposition process uses the thermal energy as the deposition energy, the deposition process performs a thermal deposition process, such as, for example, atomic layer deposition (ALD), chemical vapor deposition (CVD), or the like. In some embodiments when the deposition process uses the plasma energy as the deposition energy, the deposition process performs a plasma assisted deposition process, such as, for example, plasma enhanced ALD (PEALD), plasma enhanced CVD (PECVD), or the like. In some embodiments when the deposition process uses the plasma energy and the EM radiation energy (such as UV or laser energy) as the deposition energy, the deposition process performs a plasma and laser assisted deposition (PLAD) process, such as, for example, plasma and laser enhanced ALD, plasma and laser enhanced CVD, or the like.

The deposition system 100 comprises a chamber 101 and an inlet 103 configured to accept and deliver a desired precursor material into the chamber 101 and to a showerhead 105. The showerhead 105 may be utilized to disperse the chosen precursor material(s) into the chamber 101 and may be designed to evenly disperse the precursor material in order to minimize undesired process conditions that may arise from uneven dispersal. In an embodiment, the showerhead 105 may have a circular design with openings dispersed evenly around the showerhead 105 to allow for the dispersal of the desired precursor material into the chamber 101.

However, as one of ordinary skill in the art will recognize, the introduction of precursor materials to the chamber 101 through a single showerhead 105 or through a single point of introduction as described above is intended to be illustrative only and is not intended to be limiting to the embodiments. Any number of separate and independent showerheads and/or other openings to introduce precursor materials into the chamber 101 may be utilized. All such combinations of showerheads and other points of introduction are fully intended to be included within the scope of the embodiments.

The chamber 101 may receive the desired precursor materials and expose the substrate 200 to the precursor materials, and the chamber 101 may be any desired shape that may be suitable for dispersing the precursor materials and contacting the precursor materials with the substrate 200. In the embodiment illustrated in FIG. 1A, the chamber 101 has a cylindrical sidewall and a bottom. However, the chamber 101 is not limited to a cylindrical shape, and any other suitable shape, such as a hollow square tube, an octagonal shape, or the like, may be utilized. Furthermore, the chamber 101 may be made of material that is inert to the various process materials. As such, while the chamber 101 may be made of any suitable material that can withstand the chemistries and pressures involved in the deposition process, in some embodiments, the chamber 101 may be made of steel, stainless steel, nickel, aluminum, alloys of these, combinations of these, or like.

Within the chamber 101, the substrate 200 may be placed on a mounting platform 107 in order to position and control the substrate 200 during the deposition processes. The mounting platform 107 may include heating mechanisms 109 in order to heat the substrate 200 during the deposition processes. The heating mechanisms 109 may be resistive heating elements or the like. The mounting platform 107 may be also referred to as a pedestal or a chuck. In the illustrated embodiment, the mounting platform 107 has a same diameter as the showerhead 105.

In some embodiments, a precursor material may be ignited into a plasma 135 in order to assist in the deposition process. The plasma 135 comprises dissociated components (such as electrically charged and/or neutral components) of the precursor material. In such embodiment, the mounting platform 107 may additionally comprise a first electrode 111. The first electrode 111 may be grounded or biased by a desired voltage source (not shown). By being electrically biased, the first electrode 111 is used to provide a bias to the incoming precursor material as well as assist to ignite the precursor material into a plasma. Additionally, the first electrode 111 is also utilized to maintain the precursor plasma during the deposition process by maintaining the bias.

In some embodiments, the showerhead 105 may also be or comprise (or otherwise incorporate) a second electrode 113 coupled to a power source 115. The power source 115 is utilized to provide power to the second electrode 113 in order to ignite the plasma 135 during introduction of the precursor material. The power source 115 may be a low frequency (LF) power source (operating at frequencies between about 100 kHz to about 400 kHz), a radio frequency (RF) power source (operating at frequencies of about 13.56 MHz, about 27.12 MHz, about 60 MHz, or about 80 MHz), a microwave (MW) power source (operating at a frequency of about 2.45 GHz), or the like. In some embodiments, the power source 115 may provide a power between about 10 W and 3000 W.

However, while the deposition system 100 is descried above as an in situ capacitively coupled plasma (CCP) system, embodiments are not intended to be limited to the in situ CCP system. Rather, any suitable in situ or remote plasma systems, such as inductively coupled plasma systems, magnetically enhanced reactive ion etching, electron cyclotron resonance systems, or the like, may be utilized. All such systems are fully intended to be included within the scope of the embodiments.

Furthermore, while a single mounting platform 107 is illustrated in FIG. 1A, any number of mounting platforms may additionally be included within the chamber 101. Additionally, the chamber 101 and the mounting platform 107 may be part of a cluster tool system (not shown). The cluster tool system may be used in conjunction with an automated handling system in order to position and place the substrate 200 into the chamber 101 prior to the deposition processes, position, hold the substrate 200 during the deposition processes, and remove the substrate 200 from the chamber 101 after the deposition processes.

The chamber 101 may also have an exhaust outlet 117 for exhaust gases to exit the chamber 101. A vacuum pump (not shown) may be connected to the exhaust outlet 117 of the chamber 101 in order to help evacuate the exhaust gases. The vacuum pump may also be utilized to reduce and control the pressure within the chamber 101 to a desired pressure and may also be utilized to evacuate precursor materials from the chamber 101 in preparation for the introduction of the next precursor material.

In some embodiments, the deposition system 100 comprises one or more electromagnetic (EM) radiation sources 119 that are coupled to the chamber 101. The EM radiation sources 119 may be ultraviolet (UV) or laser systems, such as an $F_2$ system (operating at 157 nm wavelength), an ArF system (operating at 193 nm wavelength), a Nd:YAG system (operating at 213 nm, 266 nm, 355 nm, or 532 nm wavelengths), a He—Ag system (operating at 224.3 nm wavelength), a KCl system (operating at 222 nm wavelength), a KrF system (operating at 248 nm wavelength), a XeCl system (operating at 308 nm wavelength), a He—Cd system (operating at 325 nm wavelength), an $N_2$ system (operating at 337.1 nm wavelength), a XeF system (operating at 351 nm wavelength), a He—Cd system (operating at 441.6 nm wavelength), or the like. In some embodiments, an EM radiation 121 (indicated by arrows in FIG. 1A) generated by the EM radiation sources 119 propagate in the chamber 101 between the showerhead 105 and the mounting platform 107. The EM radiation 121 further dissociates, heats or excites the precursor material. In some embodiments, the EM radiation sources 119 is chosen based on the precursor material, such that the EM radiation 121 from the EM radiation sources 119 is able to dissociate, heat or excite the precursor material. In the illustrated embodiment, the deposition system 100 comprises two EM radiation sources 119. In other embodiments, the deposition system 100 may comprise one or more than two EM radiation sources 119. In some embodiments, energy of the EM radiation sources 119 may be in a range from about 1 eV to about 20 eV.

In some embodiments, the EM radiation 121 from each of the EM radiation sources 119 enters the chamber 101 through a respective window 123 in the chamber 101. The material for the windows 123 are chosen to provide good vacuum isolation to the chamber 101 as well as be transparent to the EM radiation 121. In some embodiments, the windows 123 are made of quartz, glass, a combination thereof, or the like.

In some embodiments, the chamber 101 comprises inlets 125 near respective windows 123. Each of the inlets 125 is configured to accept a desired gas 131 (indicated by dashed arrows in FIG. 1B) and form a gas curtain 133 in front of the respective window 123. The gas 131 may comprise an inert gas such as He gas, Ne gas, Ar gas, a combination thereof, or the like. In some embodiments, the gas curtains 133 are used to protect the windows 123, such that the material deposited over the substrate 200 is not also deposited on the windows 123. Accordingly, lifetime of the windows 123 is increased and reduction of the intensity of the EM radiation 121 is avoided. In some embodiments, each of the inlets 125 comprises a valve 127 that is used to control a flow rate of the gas 131.

Figure 2:
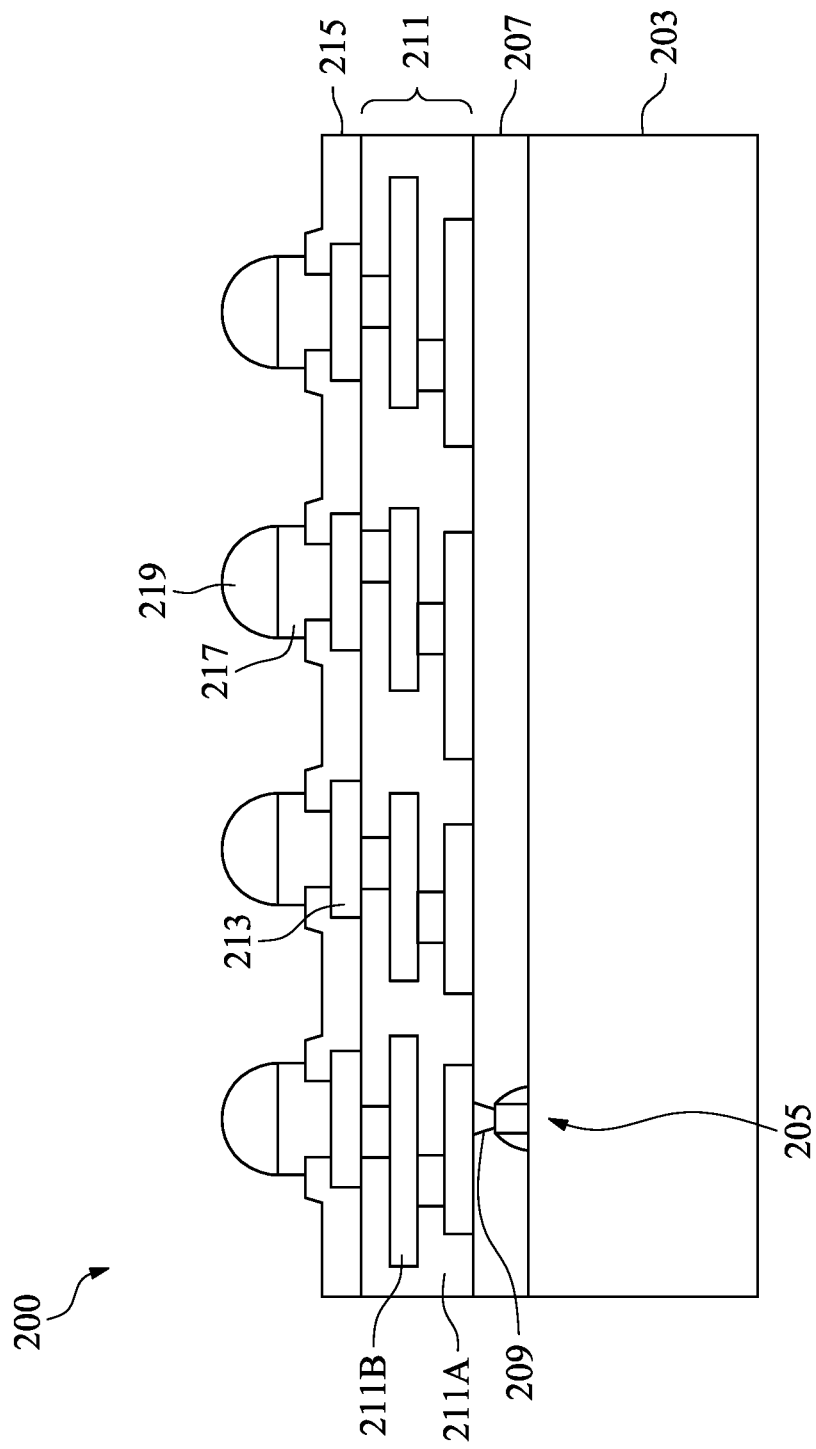
FIG. 2 illustrates a cross-sectional view of a substrate in accordance with some embodiments.

FIG. 2 illustrates a cross-sectional view of a substrate 200 in accordance with some embodiments. In some embodiments, the substrate 200 may be a wafer-level structure. In other embodiments, the substrate 200 may be a die-level structure. In some embodiments, the substrate 200 comprises a semiconductor substrate 203, such as silicon, doped or undoped, or an active layer of a semiconductor-on-insulator (SOI) substrate. The semiconductor substrate 203 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 203 has an active surface (e.g., the surface facing upwards in FIG. 2), sometimes called a front side, and an inactive surface (e.g., the surface facing downwards in FIG. 2), sometimes called a backside.

Devices (represented by a transistor) 205 may be formed at the front surface of the semiconductor substrate 203. The devices 205 may be active devices (e.g., transistors, diodes, etc.), capacitors, resistors, inductors, the like, or combinations thereof. An inter-layer dielectric (ILD) 207 is over the front surface of the semiconductor substrate 203. The ILD 207 surrounds and may cover the devices 205. The ILD 207 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like, and may be formed using spin coating, lamination, ALD, CVD, or the like.

Conductive plugs 209 extend through the ILD 207 to electrically and physically couple to the devices 205. For example, when the devices 205 are transistors, the conductive plugs 209 may couple to the gates and source/drain regions of the transistors. The conductive plugs 209 may be formed of tungsten, cobalt, nickel, copper, silver, gold, aluminum, the like, or combinations thereof.

An interconnect structure 211 is over the ILD 207 and the conductive plugs 209. The interconnect structure 211 interconnects the devices 205 to form an integrated circuit. The interconnect structure 211 may be formed by, for example, metallization patterns 211B in inter-metal dielectrics (IMDs) 211A on the ILD 207. The IMDs 211A may be formed using similar material and methods as the ILD 207. The metallization patterns 211B may be formed of tungsten, cobalt, nickel, copper, silver, gold, aluminum, the like, or combinations thereof. The metallization patterns 211B include metal lines and vias within the IMDs 211A. In some embodiments, the interconnect structure 211 may be formed of alternating layers of dielectric (e.g., low-k dielectric material) and conductive (e.g., copper) materials with vias interconnecting the layers of the conductive material and may be formed through any suitable process (such as deposition, damascene, dual damascene, or the like). The metallization patterns 211B of the interconnect structure 211 are electrically coupled to the devices 205 by the conductive plugs 209.

The substrate 200 further includes pads 213, such as aluminum pads, to which external connections are made. The pads 213 are on the active side of the semiconductor substrate 203, such as in and/or on the interconnect structure 211. An insulating layer 215 is on the interconnect structure 211, such that the pads 213 are embedded in the insulating layer 215. The insulating layer 215 may also be referred to as a passivation layer. In some embodiments, the insulating layer 215 may comprise one or more layers of silicon oxide, silicon nitride, silicon oxynitride, the like, or combinations thereof, and may be formed using ALD, CVD, or the like. In some embodiments, the pads 213 and the insulating layer 215 may be formed by forming and patterning a conductive material over the interconnect structure 211 to form the pads 213, forming the insulating layer 215 over the interconnect structure 211 and the pads 213, and patterning the insulating layer 215 to form opening in the insulating layer 215 exposing the pads 213.

In some embodiments, under-bump metallizations (UBMs) 217 are formed over the pads 213. The UBMs 217 extend through the openings in the insulating layer 215 and are physically and electrically coupled to respective pads 213. The UBMs 217 may be formed of one or more layers of suitable conductive materials. In some embodiments, the UBMs 217 include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the UBMs 217. Any suitable materials or layers of material that may be used for the UBMs 217 are fully intended to be included within the scope of the current application.

After forming the UBMs 217, conductive connectors 219 are formed on the UBMs 217. The conductive connectors 219 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 219 may include a conductive material such as solder, copper, aluminum, gold, nickel, silver, palladium, tin, the like, or a combination thereof. In some embodiments, the conductive connectors 219 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 219 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Referring further to FIG. 2, the deposition system 100 (see FIGS. 1A and 1B) may be used to deposit various layers over the semiconductor substrate 203 during the formation of the substrate 200. For example, insulating layers (such as, for example, the ILD 207, IMDs 211A, or the insulating layer 215), mask layers (such as, for example, mask layers used while forming the devices 205 or the metallization patterns 211B), dummy gate layers (such as, for example, dummy gate layers used while forming the devices 205), or the like may be deposited using the deposition system 100.

Figure 3:
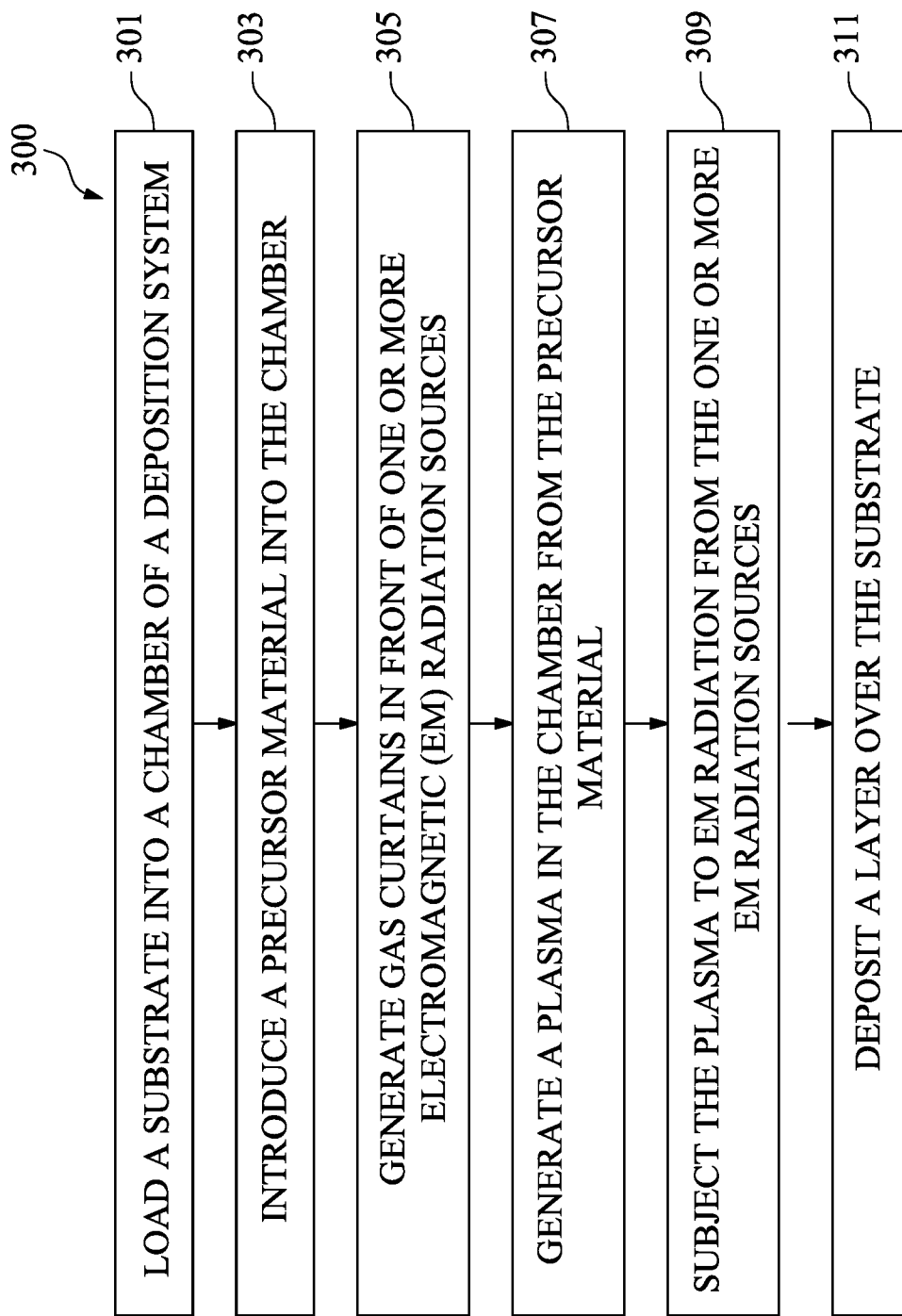
FIG. 3 is a flow diagram illustrating a deposition method in accordance with some embodiments.

FIG. 3 is a flow diagram illustrating a deposition method 300 in accordance with some embodiments. In some embodiments, the deposition method 300 is performed by the deposition system 100 (see FIGS. 1A and 1B). In the illustrated embodiment, the deposition method 300 is a plasma and laser assisted deposition (PLAD) process. The deposition method 300 may be integrated into an ALD process, or a CVD process.

Referring to FIGS. 1A, 1B, and 3, in some embodiments, the deposition method 300 starts with step 301, when the substrate 200 is loaded into the chamber 101 of the deposition system 100. The substrate 200 is placed on the mounting platform 107.

In step 303, a precursor material is introduced into the chamber 101 using the inlet 103. In some embodiments, the showerhead 105 is utilized to disperse the precursor material into the chamber 101. In some embodiments, a flow rate of the precursor material is between about 5 sccm and about 5 slm. In some embodiments when the deposited layer 201 comprises amorphous silicon (a-Si), the precursor material comprises a gas such as $SiH_4$, $Si_2H_6$, $SiCl_2H_2$, $SiCl_4$, $Si_2Cl_6$, or the like. In some embodiments when the deposited layer 201 comprises amorphous carbon (a-C), the precursor material comprises a gas mixture including $CH_4$ and Ar, a gas mixture including $CH_4$ and $H_2$, a gas mixture including $C_2H_4$ and Ar, a gas mixture including $C_2H_4$ and $H_2$, a gas mixture including $C_2H_2$ and Ar, a gas mixture including $C_2H_2$ and $H_2$, or the like.

In step 305, gas curtains 133 are generated in front of one or more EM radiation sources 119. In some embodiments, an inert gas 131 (such as He gas, Ne gas, Ar gas, a combination thereof, or the like) is introduced into the chamber 101 through inlets 125 to generate the gas curtains 133. The gas curtains 133 protect respective windows 123 from the deposition process performed by the deposition system 100. Accordingly, lifetime of the windows 123 is increased and reduction of the intensity of the EM radiation 121 from the EM radiation sources 119 is avoided. In some embodiments, a flow rate of the gas 131 is between about 5 sccm and about 20 slm.

In step 307, a plasma 135 is generated in the chamber 101 of the deposition system 100 from the precursor material. In some embodiments, the power source 115 is used to energize the second electrode 113 and ignites the plasma 135 in a gap between the showerhead 105 and the mounting platform 107. In some embodiments, the precursor material is decomposed into various components, such as charged components (electrons, positive ions and/or negative ions) and neutral components (neutral radicals and/or un-decomposed neutral molecules/atoms). In some embodiments, the plasma ignition process may not precisely control the precursor material decomposition process, which may affect a quality of the deposited layer. The power source 115 may provide a power between about 10 W to about 3000 W. The power source 115 may be operated at a frequency between about 100 kHz to about 400 kHz, 13.56 MHz, 27.12 MHz, 60 MHz, 80 MHz or 2.45 GHz.

In step 309, the plasma 135 is subjected to the EM radiation 121 from the EM radiation sources 119. In some embodiments, the EM radiation 121 further decomposes the precursor material into various components. The EM radiation 121 allows a precise control of a precursor decomposition reaction by precisely controlling a wavelength (or, equivalently, energy) of the EM radiation 121. Accordingly, the EM radiation sources 119 may be chosen based on the desired precursor decomposition reaction. In some embodiments when the deposited layer 201 is an a-Si layer, the precursor material $SiH_4$ may be decomposed into different components based on the wavelength (or, equivalently, the energy) of the EM radiation 121. In some embodiments when 306.13 nm wavelength (or, equivalently, 4.5 eV energy) EM radiation sources 119 are used to generate the EM radiation 121, the precursor material $SiH_4$ is decomposed according to the following decomposition reaction $$SiH_4 \rightarrow SiH_3^+ + H^+ + e^-.$$

In some embodiments when 130.92 nm wavelength (or, equivalently, 9.47 eV energy) EM radiation sources 119 is used to generate the EM radiation 121, the precursor material $SiH_4$ is decomposed according to the following decomposition reaction $$SiH_4 \rightarrow SiH_2^+ + 2H^+ + 2e^-.$$

In some embodiments when 117.74 nm wavelength (or, equivalently, 10.53 eV energy) EM radiation sources 119 is used to generate the EM radiation 121, the precursor material $SiH_4$ is decomposed according to the following decomposition reaction $$SiH_4 \rightarrow Si^+ + 4H^+ + 4e^-.$$

In some embodiments, by precisely controlling the precursor decomposition reaction, composition of the deposited layer 201 may be precisely controlled. In some embodiments when the deposited layer 201 is an a-Si layer, hydrogen (H) content in the a-Si layer may be precisely controlled. In some embodiments, a substantially pure a-Si layer may be deposited by using the 117.74 nm wavelength (or, equivalently, 10.53 eV energy) EM radiation sources 119. In some embodiments, a-Si layer having a silicon to hydrogen ratio (Si:H) of about 1:2 may be deposited by using the 130.92 nm wavelength (or, equivalently, 9.47 eV energy) EM radiation sources 119.

In some embodiments when the deposited layer 201 is an a-C layer, hydrogen (H) content in the a-C layer may be precisely controlled. In some embodiments, the hydrogen (H) content may be controlled from about 0 at % to about 80 at %. In some embodiments when the deposited layer 201 is an a-C layer, bonding type and ratio may be precisely controlled within the a-C layer. In some embodiments when the EM radiation sources 119 are not used and the plasma 135 provides the deposition energy, the a-C layer comprises more sp2 bonds than sp3 bonds. By using the EM radiation sources 119, the content of the sp3 bonds may be increased up to 100%, when the structure of the a-C layer is similar to diamond.

In step 311, a layer (such as the deposited layer 201) is deposited over the substrate 200. In some embodiments, decomposed precursor components react with each other to form the deposited layer 201 over the substrate 200. In some embodiments, the deposition method 300 is performed at a temperature between about 50° C. and 400° C. In some embodiments, the heating mechanisms 109 of the mounting platform 107 are used to heat the substrate 200 to a desired temperature.

Figure 4:
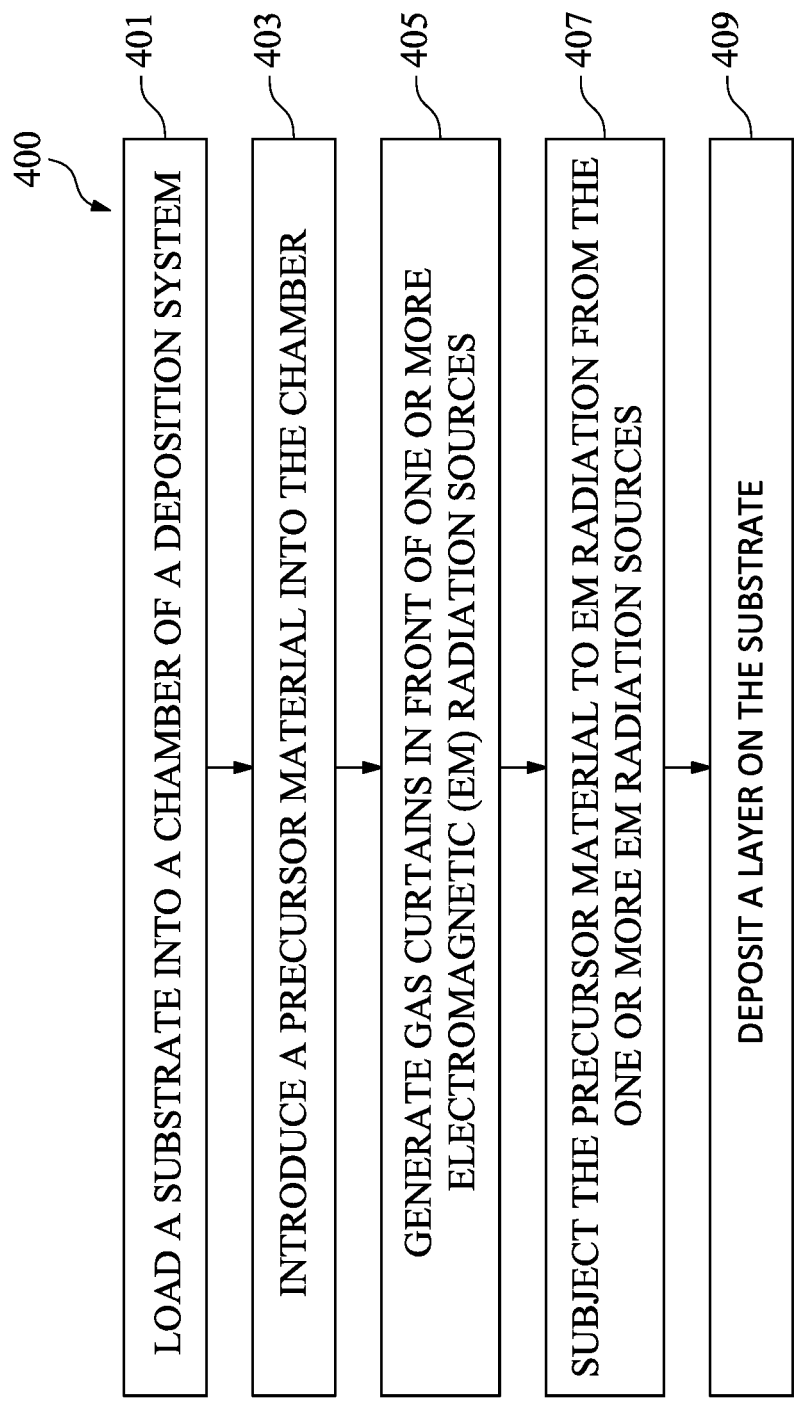
FIG. 4 is a flow diagram illustrating a deposition method in accordance with some embodiments.

FIG. 4 is a flow diagram illustrating a deposition method 400 in accordance with some embodiments. In some embodiments, the deposition method 400 is performed by the deposition system 100 (see FIGS. 1A and 1B). In some embodiments, the deposition method 400 is similar to the deposition method 300 (see FIG. 3), with the distinction that the plasma generation process described above in step 307 is omitted. In the illustrated embodiment, the deposition energy is provided by thermal energy and the EM radiation energy. The deposition method 400 may be integrated into an ALD process, or a CVD process.

Referring to FIGS. 1A, 1B, and 4, in some embodiments, the deposition method 400 starts with step 401, when the substrate 200 is loaded into the chamber 101 of the deposition system 100. The substrate 200 is placed on the mounting platform 107.

In step 403, a precursor material is introduced into the chamber 101 using the inlet 103. In some embodiments, the showerhead 105 is utilized to disperse the precursor material into the chamber 101. In some embodiments, step 403 is similar to step 303 described above with reference to FIG. 3, and the description is not repeated herein.

In step 405, gas curtains 133 are generated in front of one or more EM radiation sources 119. In some embodiments, step 405 is similar to step 305 described above with reference to FIG. 3, and the description is not repeated herein. In some embodiments, the gas curtains 133 are used to protect the windows 123, such that the material deposited over the substrate 200 is not also deposited on the windows 123. Accordingly, lifetime of the windows 123 is increased and reduction of the intensity of the EM radiation 121 is avoided.

In step 407, the precursor material is subjected to the EM radiation 121 from the one or more EM radiation sources 119. In some embodiments, step 407 is similar to step 309 described above with reference to FIG. 3, and the description is not repeated herein.

In step 409, a layer (such as the deposited layer 201) is deposited over the substrate 200. In some embodiments, step 409 is similar to step 311 described above with reference to FIG. 3, and the description is not repeated herein.

Figure 5:
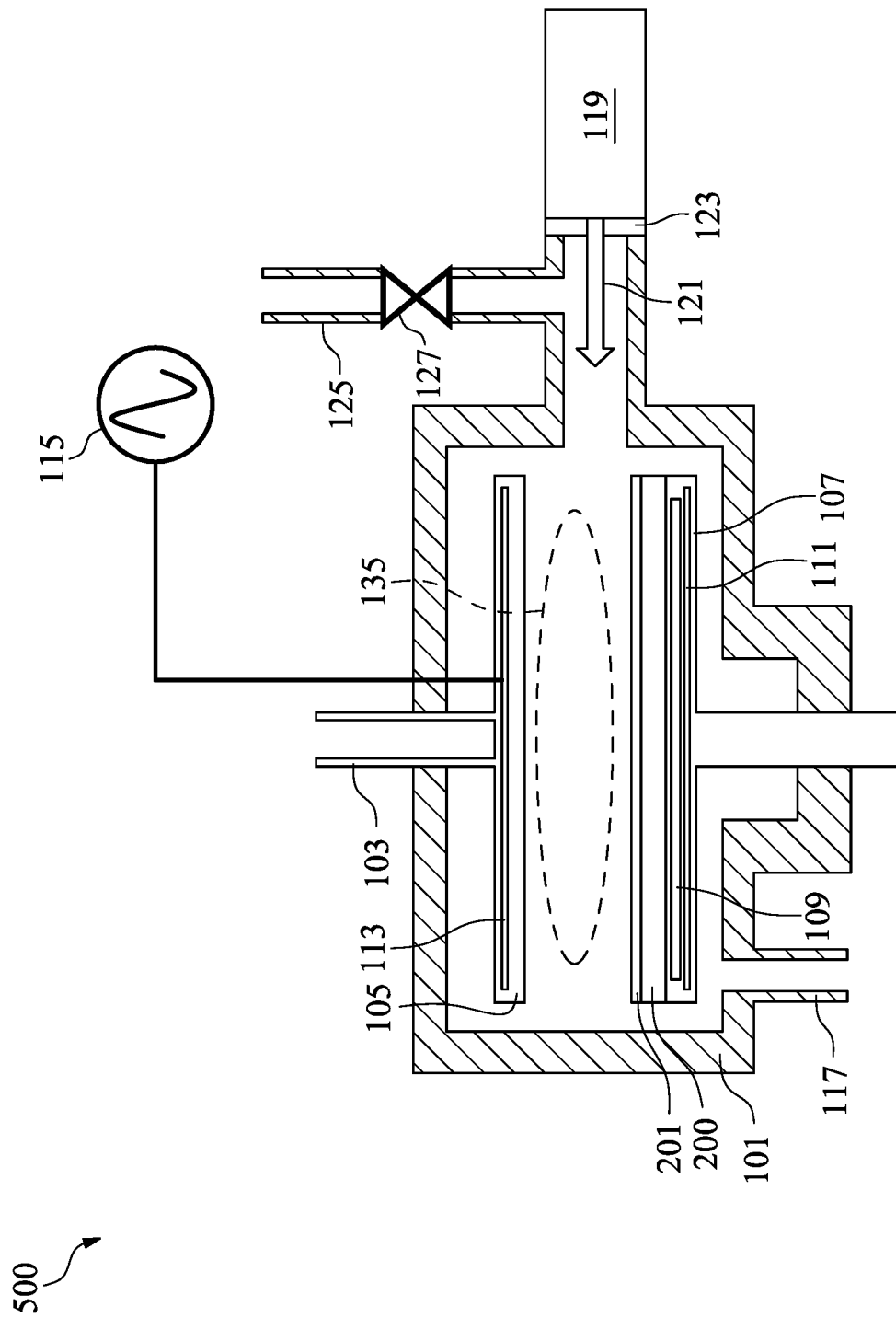
FIG. 5 illustrates a cross-sectional view of a deposition system in accordance with some embodiments.

FIG. 5 illustrate a cross-sectional view of a deposition system 500 in accordance with some embodiments. The deposition system 500 is similar to the deposition system 100 (see FIG. 1A), with like features being labeled by like numerical references, and descriptions of the like features are not repeated herein. In distinction with the deposition system 100, the deposition system 500 comprises a single EM radiation source 119. In some embodiments, the deposition methods 300 (see FIG. 3) and 400 (see FIG. 4) may be performed using the deposition system 500.

Figure 6A:
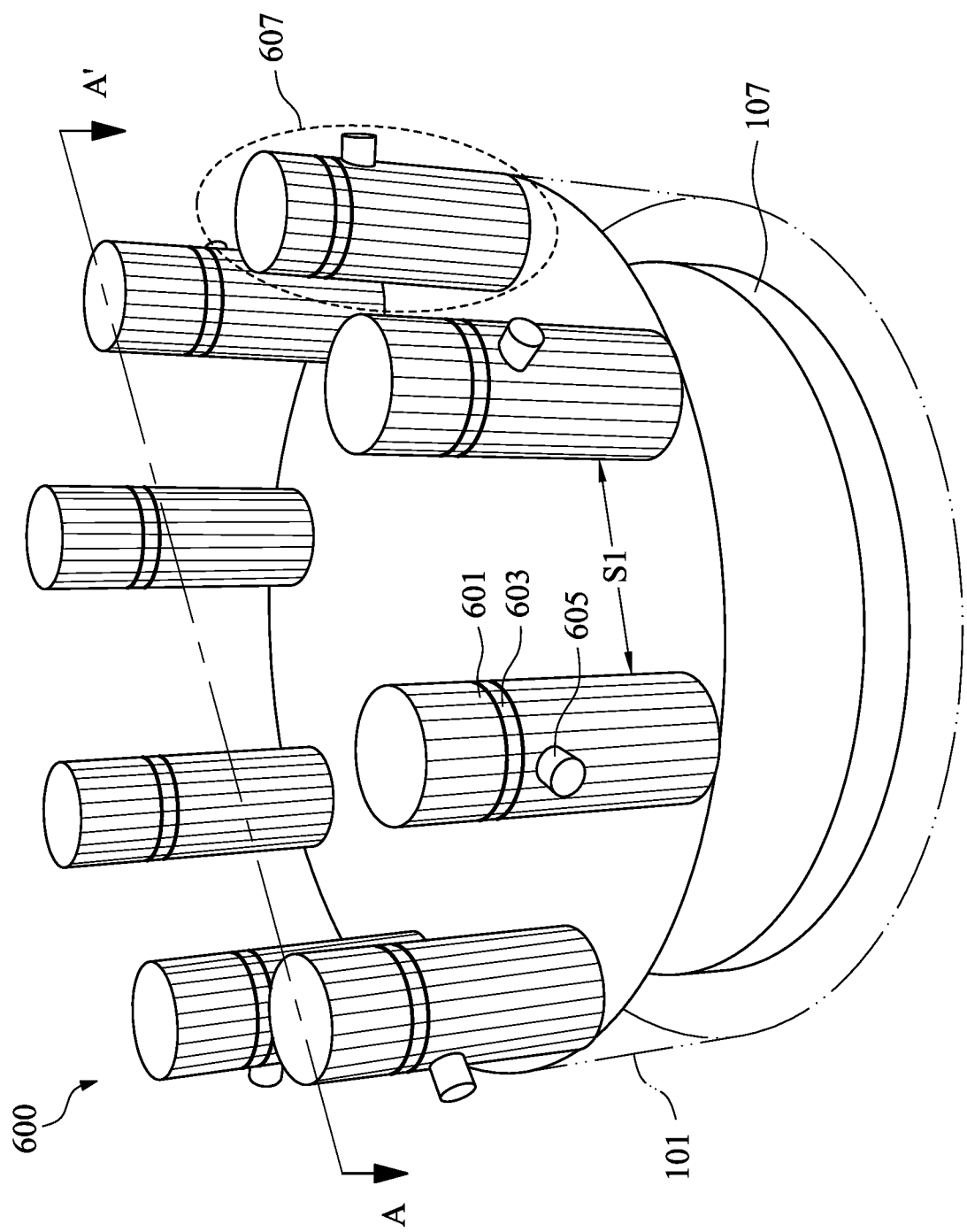
FIGS. 6A-6C illustrate three-dimensional and cross-sectional views of a deposition system in accordance with some embodiments.
Figure 6B:
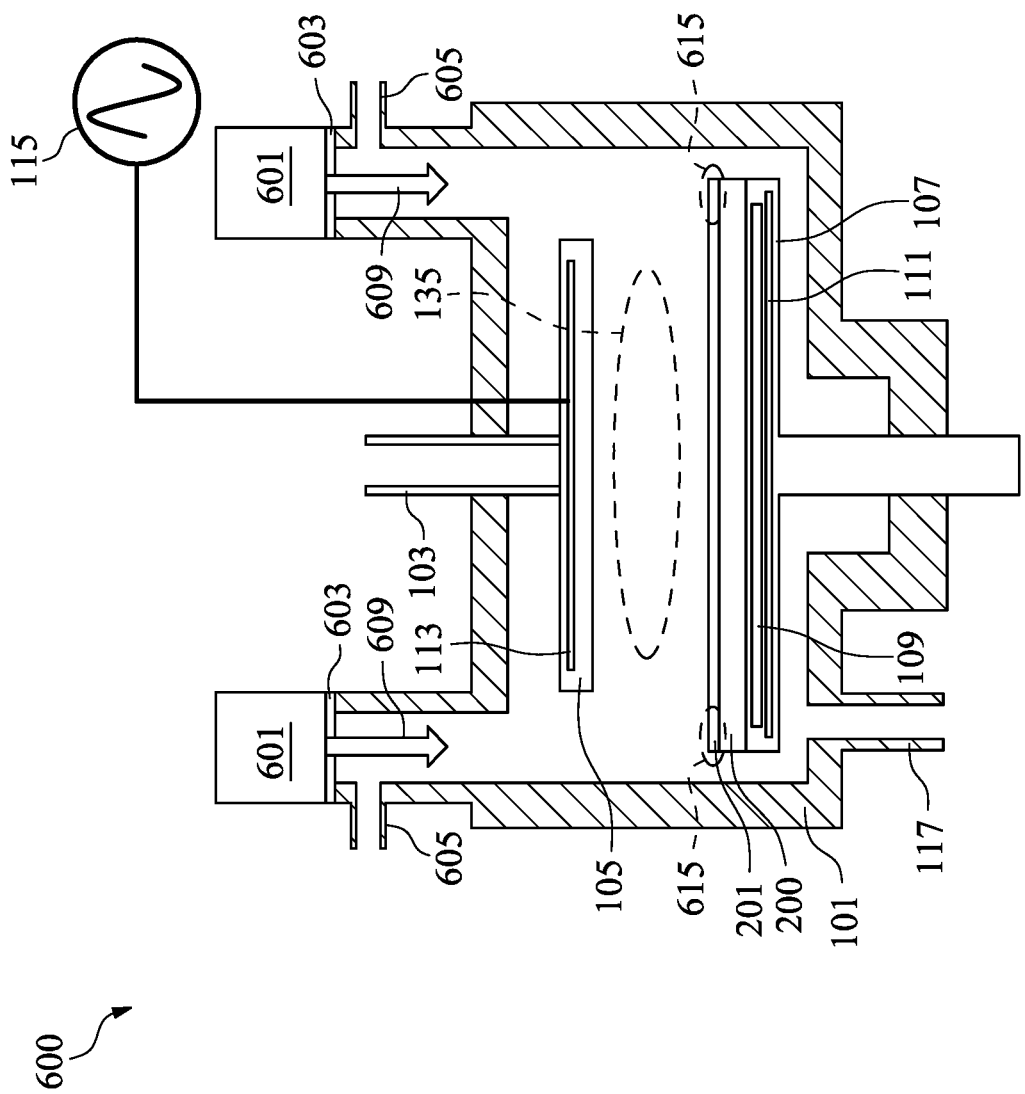
Figure 6C:
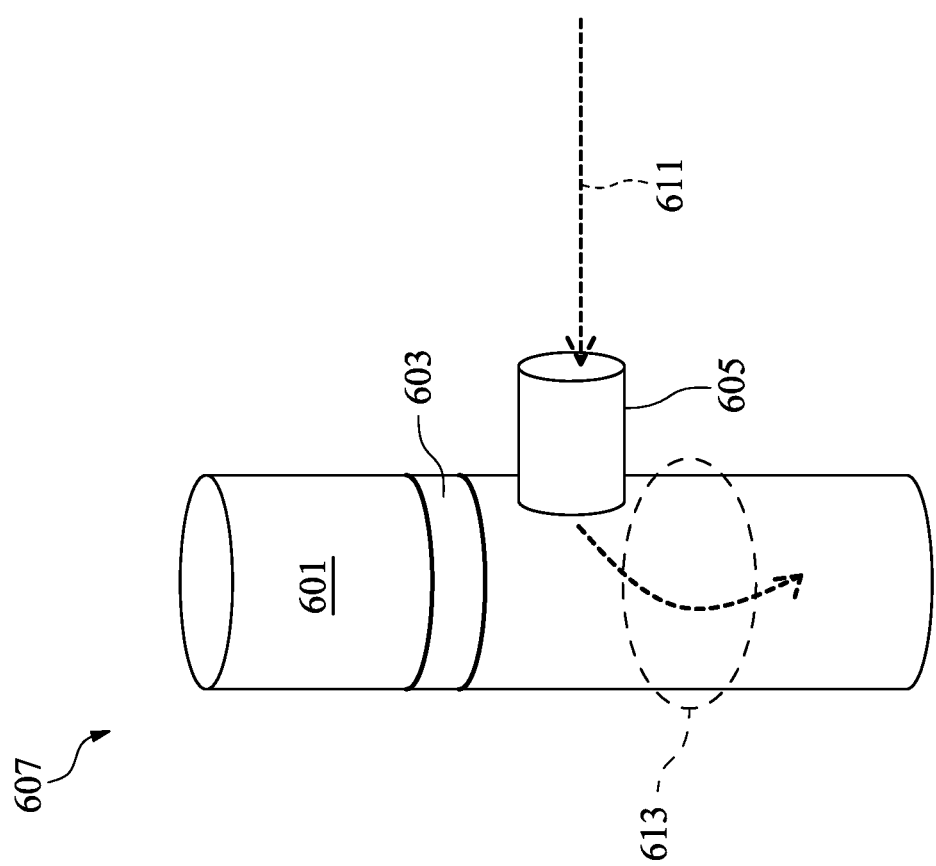

FIGS. 6A-6C illustrate a deposition system 600 in accordance with some embodiments. FIG. 6A illustrates a three-dimensional view. FIG. 6B illustrates a cross-sectional view along a section AA' in FIG. 6A. FIG. 6C illustrates detailed view of a region 607 of the deposition system 600 shown in FIG. 6A. The deposition system 600 is similar to the deposition system 100 (see FIG. 1A), with like features being labeled by like numerical references, and descriptions of the like features are not repeated herein. In the illustrated embodiment, the mounting platform 107 has a greater diameter than the showerhead 105. In distinction with the deposition system 100, the deposition system 600 comprises EM radiation sources 601 instead of the EM radiation sources 119.

In some embodiments, the EM radiation sources 601 may be UV or laser systems, such as an $F_2$ system (operating at 157 nm wavelength), an ArF system (operating at 193 nm wavelength), a Nd:YAG system (operating at 213 nm, 266 nm, 355 nm, or 532 nm wavelengths), a He—Ag system (operating at 224.3 nm wavelength), a KCl system (operating at 222 nm wavelength), a KrF system (operating at 248 nm wavelength), a XeCl system (operating at 308 nm wavelength), a He—Cd system (operating at 325 nm wavelength), an $N_2$ system (operating at 337.1 nm wavelength), a XeF system (operating at 351 nm wavelength), a He—Cd system (operating at 441.6 nm wavelength), or the like.

In some embodiments, the EM radiation sources 601 are placed such that a EM radiation 609 (indicated by arrows in FIG. 6B) generated by each of the EM radiation sources 601 propagates toward a respective portion of an edge of the mounting platform 107 (or, equivalently, a respective portion of an edge of the substrate 200 when the substrate 200 is placed on the mounting platform 107). In some embodiments, the EM radiation sources 601 are placed along the edge of the mounting platform 107 (or, equivalently, the edge of the substrate 200 when the substrate 200 is placed on the mounting platform 107) in a plan view and have a uniform spacing S1. The spacing S1 may be between about 200 mm and about 50 mm. In some embodiments, the deposition system 600 comprises an even number of the EM radiation sources 601. In some embodiments when the mounting platform 107 has a circular shape in a plan view, the EM radiation sources 601 are grouped into pairs, such that EM radiation sources 601 in each of the pairs are placed over the mounting platform 107 (or, equivalently, over the substrate 200 when the substrate 200 is placed on the mounting platform 107) in diametrically opposite points in the plan view. In the illustrated embodiment, the deposition system 600 comprises eight EM radiation sources 601. In some embodiments, the eight EM radiation sources 601 may be placed in one and a half o'clock position, three o'clock position, four and a half o'clock position, six o'clock position, seven and a half o'clock position, nine o'clock position, ten and a half o'clock position, and twelve o'clock position, respectively. In some embodiments, the EM radiation 609 generated by each of the EM radiation sources 601 illuminates a respective portion of the edge of the substrate 200. In some embodiments, each of the EM radiation sources 601 is directly over a respective portion of the edge of the substrate 200. In some embodiments, each of the EM radiation sources 601 overlaps with the edge of the mounting platform 107 (or, equivalently, the edge of the substrate 200) in a plan view. In some embodiments, by placing plurality of EM radiation sources 601 having uniform spacing over the mounting platform 107, the edge of the substrate 200 is uniformly illuminated by the EM radiation sources 601.

In some embodiments, the EM radiation 609 from each of the EM radiation sources 601 enters the chamber 101 through respective windows 603 in the chamber 101. The material for the windows 603 are chosen to provide good vacuum isolation to the chamber 101 as well as be transparent to the EM radiation 609. In some embodiments, the windows 603 are made of quartz, glass, a combination thereof, or the like. As described below in greater detail, the EM radiation 609 from each of the EM radiation sources 601 is used to remove cluster defects 615 formed in the deposited layer 201 at the edge of the substrate 200. In some embodiments, the EM radiation 609 of each of the EM radiation sources 601 is aligned with a respective portion of the edge of the substrate 200 and burns the cluster defects 615.

In some embodiments, the chamber 101 comprises inlets 605 near respective windows 603. Each of the inlets 605 is configured to accept a desired gas 611 (indicated by dashed arrows in FIG. 6C) and forms a gas curtain 613 in front of the respective window 603. The gas 611 may comprise an inert gas such as He gas, Ne gas, Ar gas, a combination thereof, or the like. In some embodiments, the gas curtains 613 are used to protect the windows 603, such that the material deposited over the substrate 200 is not also deposited on the windows 603. Accordingly, lifetime of the windows 603 is increased and reduction of the intensity of the EM radiation 609 is avoided.

Figure 7:
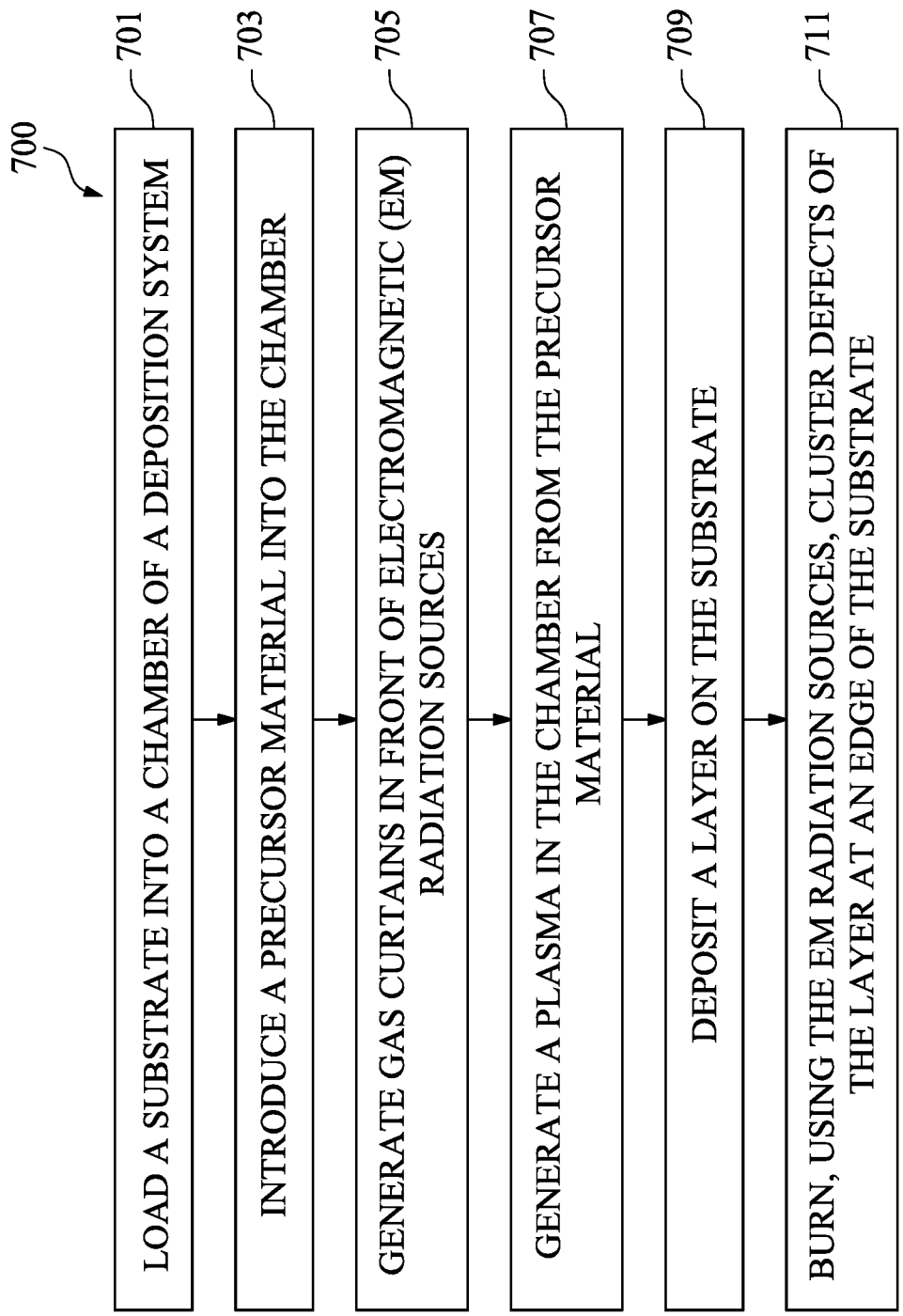
FIG. 7 is a flow diagram illustrating a deposition method in accordance with some embodiments.

FIG. 7 is a flow diagram illustrating a deposition method 700 in accordance with some embodiments. In some embodiments, the deposition method 700 is performed by the deposition system 600 (see FIGS. 6A-6C). The deposition method 700 may be integrated into an ALD process, or a CVD process.

Referring to FIGS. 6A-6C and 7, in some embodiments, the deposition method 700 starts with step 701, when the substrate 200 is loaded into the chamber 101 of the deposition system 600. The substrate 200 is placed on the mounting platform 107.

In step 703, a precursor material is introduced into the chamber 101 using the inlet 103. In some embodiments, the showerhead 105 is to disperse the precursor material into the chamber 101. In some embodiments, step 703 is similar to step 303 described above with reference to FIG. 3, and the description is not repeated herein.

In step 705, gas curtains 613 are generated in front of the EM radiation sources 601. In some embodiments, an inert gas 611 (such as He gas, Ne gas, Ar gas, a combination thereof, or the like) is introduced into the chamber 101 through the inlets 605 to generate the gas curtains 613. The gas curtains 613 protect respective windows 603 from the deposition process performed by the deposition system 600. Accordingly, lifetime of the windows 603 is increased and reduction of the intensity of the EM radiation 609 from the EM radiation sources 601 is avoided. In some embodiments, a flow rate of the gas 611 is between about 5 sccm and about 20 slm.

In step 707, a plasma 135 is generated in the chamber 101 of the deposition system 600 from the precursor material. In some embodiments, step 707 is similar to step 307 described above with reference to FIG. 3, and the description is not repeated herein. In some embodiments, the plasma 135 comprises decomposed precursor components.

In step 709, a layer (such as the deposited layer 201) is deposited over the substrate 200. In some embodiments, decomposed precursor components react with each other to form the deposited layer 201 over the substrate 200. In some embodiments, the deposition method 700 is performed at a temperature between about 50° C. and 400° C. In some embodiments, the heating mechanisms 109 of the mounting platform 107 are used to heat the substrate 200 to a desired temperature.

In step 711, the EM radiation 609 from the EM radiation sources 601 is used to burn cluster defects 615 formed in the deposited layer 201 at the edge of the substrate 200. In some embodiments when the deposited layer 201 is an a-Si layer, the cluster defects 615 may comprise hydrogen-doped a-Si (a-Si:H). In some embodiments, the EM radiation sources 601 may be high energy sources having energies greater than about 10 eV. In some embodiments, the EM radiation 609 of each of the EM radiation sources 601 illuminates a respective portion of the edge of the substrate 200 and burns the cluster defects 615. In some embodiments, each of the EM radiation sources 601 is directly over a respective portion of the edge of the substrate 200. In some embodiments, each of the EM radiation sources 601 overlaps with the edge of the mounting platform 107 (or, equivalently, the edge of the substrate 200) in a plan view.

Figure 8:
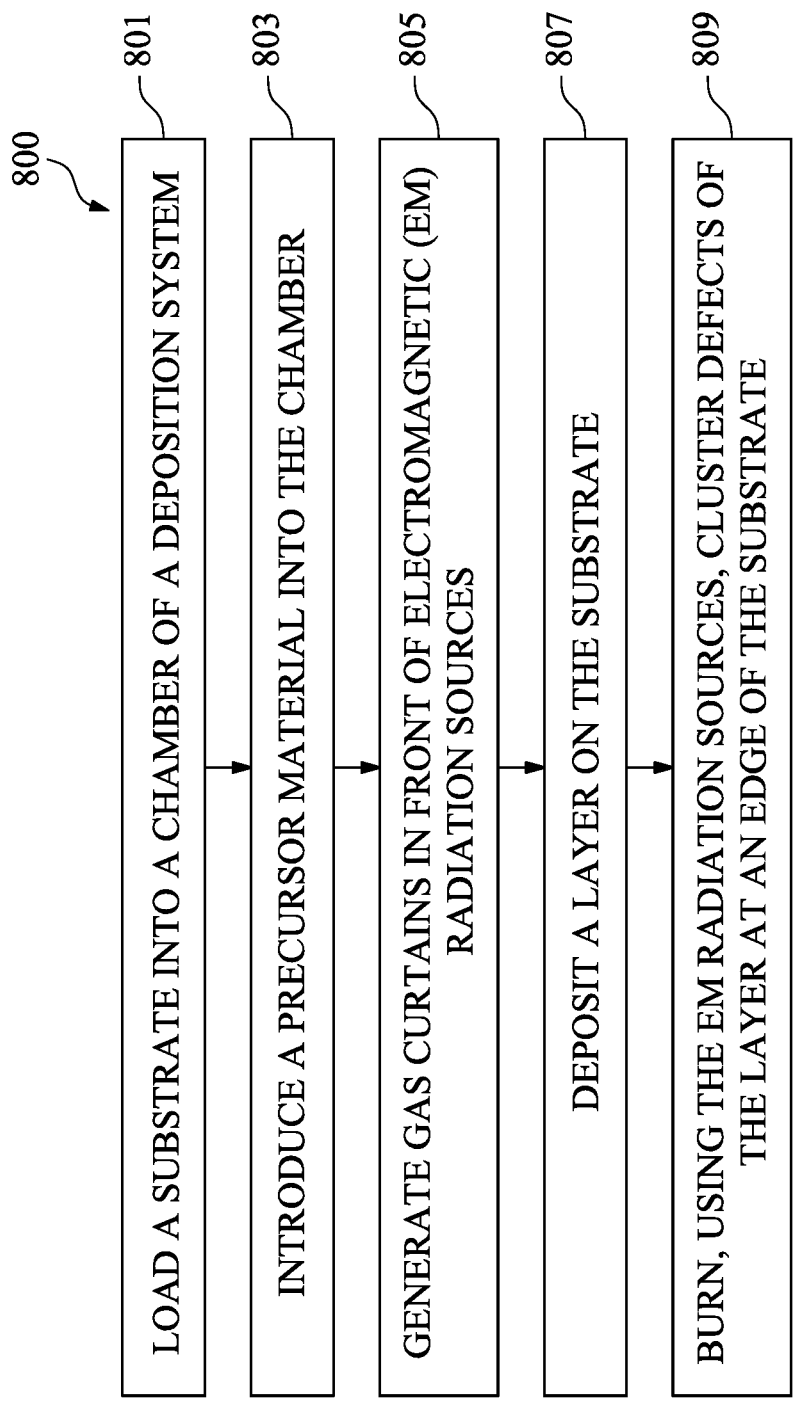
FIG. 8 is a flow diagram illustrating a deposition method in accordance with some embodiments.

FIG. 8 is a flow diagram illustrating a deposition method 800 in accordance with some embodiments. In some embodiments, the deposition method 800 is performed by the deposition system 600 (see FIGS. 6A-6C). In some embodiments, the deposition method 800 is similar to the deposition method 700 (see FIG. 7), with the distinction that the plasma generation process described in step 707 is omitted. The deposition method 800 may be integrated into an ALD process, or a CVD process.

Referring to FIGS. 6A-6C and 8, in some embodiments, the deposition method 800 starts with step 801, when the substrate 200 is loaded into the chamber 101 of the deposition system 100. The substrate 200 is placed on the mounting platform 107.

In step 803, a precursor material is introduced into the chamber 101 using the inlet 103. In some embodiments, the showerhead 105 is utilized to disperse the precursor material into the chamber 101. In some embodiments, step 803 is similar to step 303 described above with reference to FIG. 3, and the description is not repeated herein.

In step 805, gas curtains 613 are generated in front of the EM radiation sources 601. In some embodiments, step 805 is similar to step 705 described above with reference to FIG. 7, and the description is not repeated herein.

In step 807, a layer (such as the deposited layer 201) is deposited over the substrate 200. In some embodiments, the precursor material forms the deposited layer 201 over the substrate 200. In some embodiments, the deposition method 800 is performed at a temperature between about 50° C. and 400° C. In some embodiments, the heating mechanisms 109 of the mounting platform 107 are used to heat the substrate 200 to a desired temperature.

In step 809, the EM radiation 609 from the EM radiation sources 601 is used to burn cluster defects 615 formed in the deposited layer 201 at the edge of the substrate 200. In some embodiments, step 809 is similar to step 711 described above with reference to FIG. 7, and the description is not repeated herein.

Figure 9:
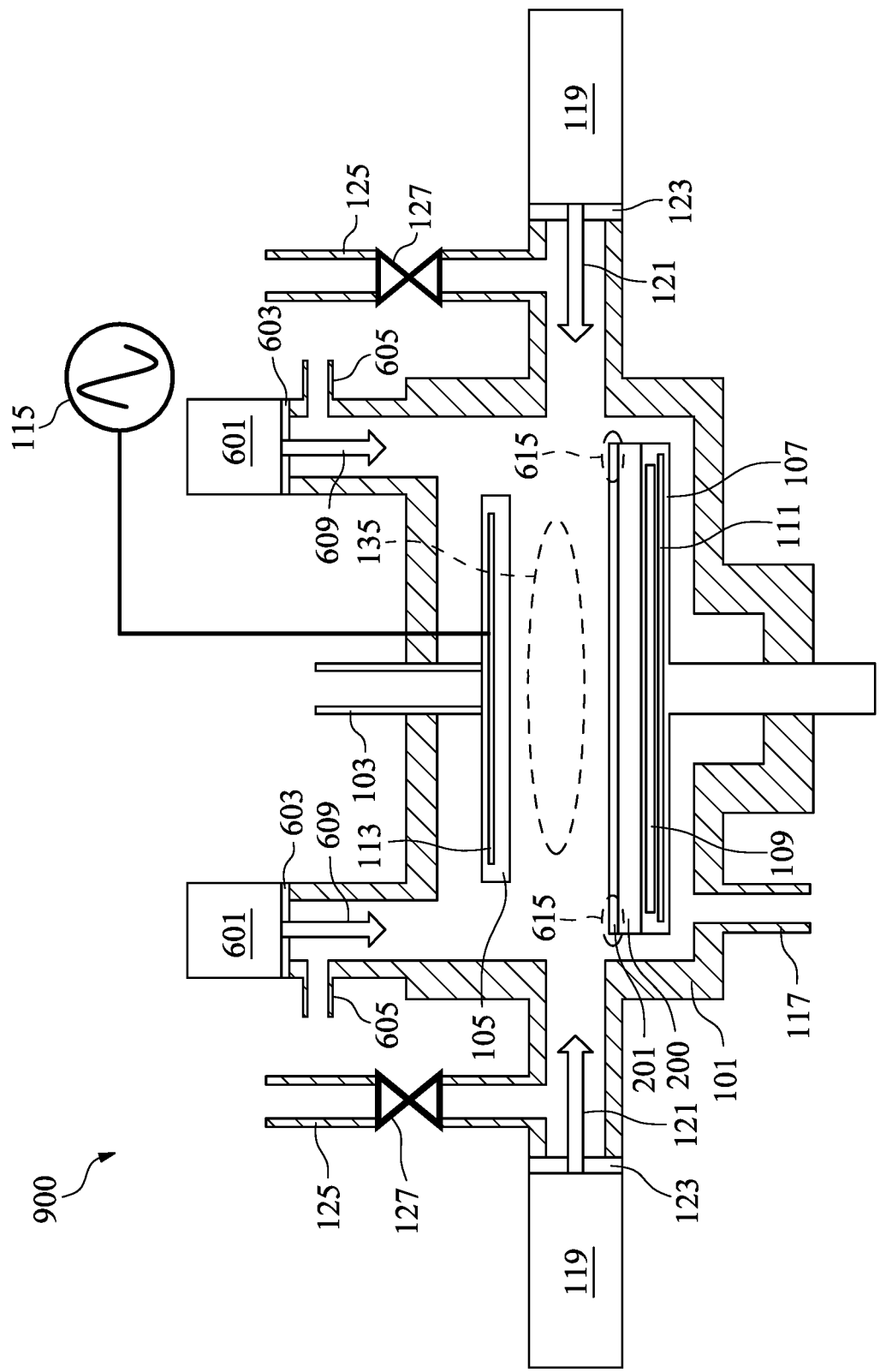
FIG. 9 illustrates a cross-sectional view of a deposition system in accordance with some embodiments.

FIG. 9 illustrates a cross-sectional view of a deposition system 900 in accordance with some embodiments. The deposition system 900 is similar to the deposition system 100 (see FIG. 1A), with like features being labeled by like numerical references, and descriptions of the like features are not repeated herein. The deposition system 900, in addition to the EM radiation sources 119, comprises EM radiation sources 601 as described above with FIGS. 6A-6C, and the description is not repeated herein.

Figure 10:
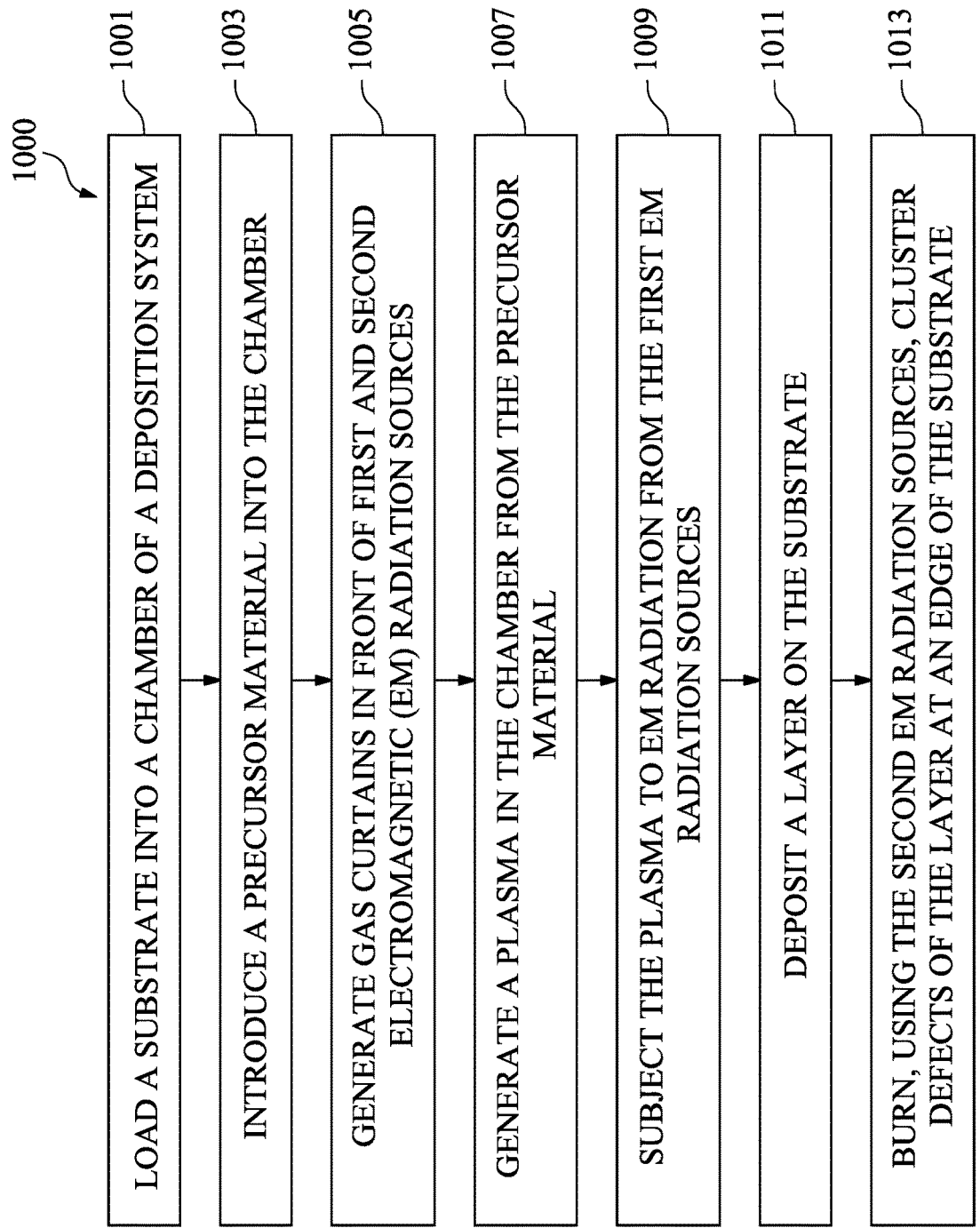
FIG. 10 is a flow diagram illustrating a deposition method in accordance with some embodiments.

FIG. 10 is a flow diagram illustrating a deposition method 1000 in accordance with some embodiments. In some embodiments, the deposition method 1000 is performed by the deposition system 900 (see FIG. 9). The deposition method 1000 may be integrated into an ALD process, or a CVD process.

Referring to FIGS. 9 and 10, in some embodiments, the deposition method 1000 starts with step 1001, when the substrate 200 is loaded into the chamber 101 of the deposition system 900. The substrate 200 is placed on the mounting platform 107.

In step 1003, a precursor material is introduced into the chamber 101 using the inlet 103. In some embodiments, the showerhead 105 is utilized to disperse the precursor material into the chamber 101. In some embodiments, step 1003 is similar to step 303 described above with reference to FIG. 3, and the description is not repeated herein.

In step 1005, gas curtains 133 (see FIG. 1B) are generated in front of the EM radiation sources 119, and gas curtains 613 (see FIG. 6C) are generated in front of the EM radiation sources 601. In some embodiments, an inert gas 131 (such as He gas, Ne gas, Ar gas, a combination thereof, or the like) is introduced into the chamber 101 through the inlets 125 to generate the gas curtains 133 (see FIG. 1B). The gas curtains 133 protect respective windows 123 from the deposition process performed by the deposition system 900. Accordingly, lifetime of the windows 123 is increased and reduction of the intensity of the EM radiation 121 from the EM radiation sources 119 is avoided. In some embodiments, a flow rate of the gas 131 is between about 5 sccm and about 20 slm.

In some embodiments, an inert gas 611 (such as He gas, Ne gas, Ar gas, a combination thereof, or the like) is introduced into the chamber 101 through the inlets 605 to generate the gas curtains 613 (see FIG. 6C). The gas curtains 613 protect respective windows 603 from the deposition process performed by the deposition system 900. Accordingly, lifetime of the windows 603 is increased and reduction of the intensity of the EM radiation 609 from the EM radiation sources 601 is avoided. In some embodiments, a flow rate of the gas 611 is between about 5 sccm and about 20 slm.

In step 1007, a plasma 135 is generated in the chamber 101 of the deposition system 900 from the precursor material. In some embodiments, step 1007 is similar to step 307 described above with reference to FIG. 3, and the description is not repeated herein.

In step 1009, the plasma 135 is subjected to the EM radiation 121 from the EM radiation sources 119. In some embodiments, the EM radiation 121 further decomposes the precursor material into various components. In some embodiments, step 1009 is similar to step 309 described above with reference to FIG. 3, and the description is not repeated herein.

In step 1011, a layer (such as the deposited layer 201) is deposited over the substrate 200. In some embodiments, decomposed precursor components react with each other to form the deposited layer 201 over the substrate 200. In some embodiments, the deposition method 1000 is performed at a temperature between about 50° C. and 400° C. In some embodiments, the heating mechanisms 109 of the mounting platform 107 are used to heat the substrate 200 to a desired temperature.

In step 1013, the EM radiation 609 from the EM radiation sources 601 is used to burn cluster defects 615 form in the deposited layer 201 at the edge of the substrate 200. In some embodiments, step 1013 is similar to step 711 described above with reference to FIG. 7, and the description is not repeated herein.

Figure 11:
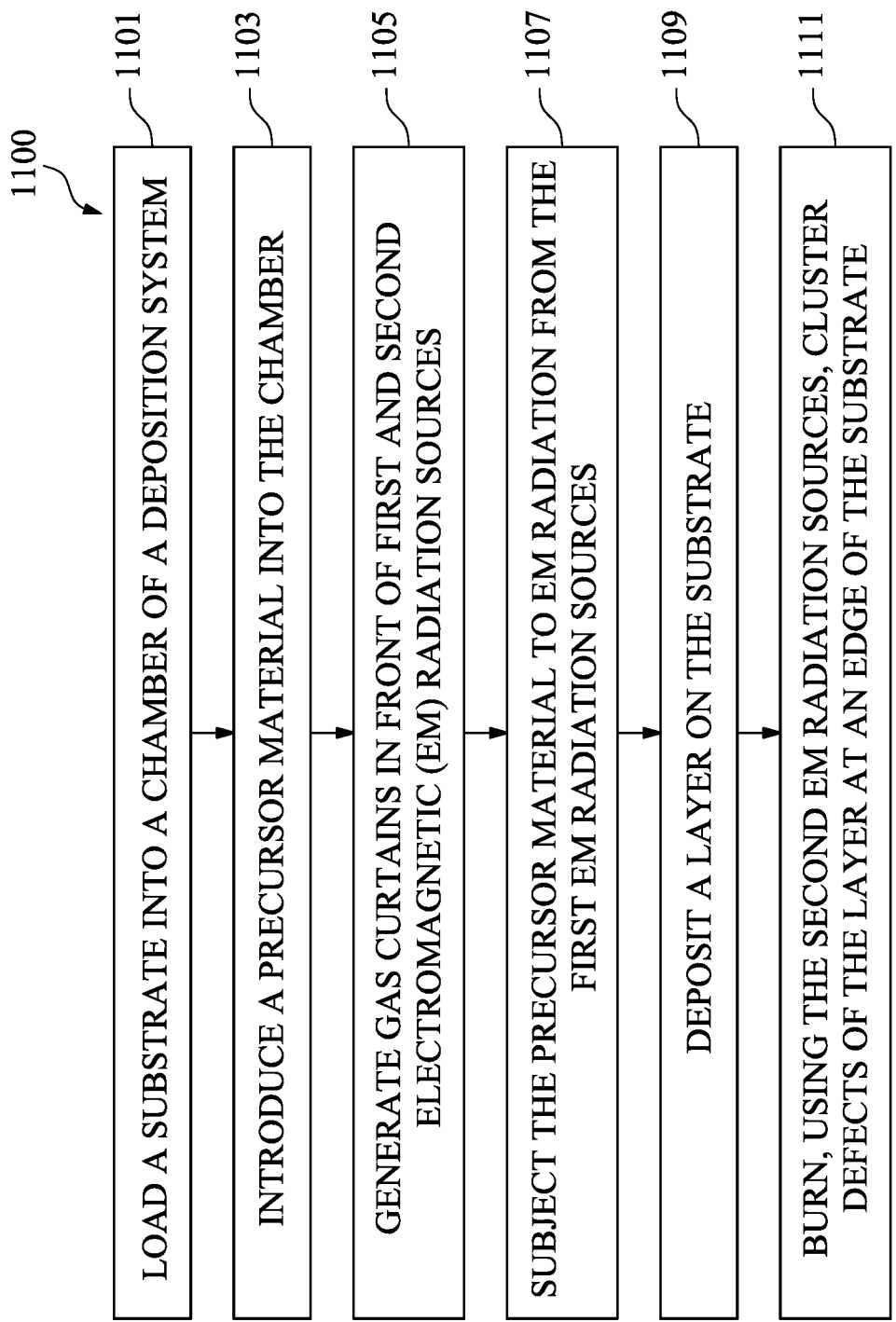
FIG. 11 is a flow diagram illustrating a deposition method in accordance with some embodiments.

FIG. 11 is a flow diagram illustrating a deposition method 1100 in accordance with some embodiments. In some embodiments, the deposition method 1100 is performed by the deposition system 900 (see FIG. 9). In some embodiments, the deposition method 1100 is similar to the deposition method 1000 (see FIG. 10), with the distinction that the plasma generation process described in step 1007 is omitted. The deposition method 1100 may be integrated into an ALD process, or a CVD process.

Referring to FIGS. 9 and 11, in some embodiments, the deposition method 1100 starts with step 1101, when the substrate 200 is loaded into the chamber 101 of the deposition system 900. The substrate 200 is placed on the mounting platform 107.

In step 1103, a precursor material is introduced into the chamber 101 using the inlet 103. In some embodiments, the showerhead 105 is utilized to disperse the precursor material into the chamber 101. In some embodiments, step 1103 is similar to step 303 described above with reference to FIG. 3, and the description is not repeated herein.

In step 1105, gas curtains 133 (see FIG. 1B) are generated in front of the EM radiation sources 119, and gas curtains 613 (see FIG. 6C) are generated in front of EM radiation sources 601. In some embodiments, step 1105 is similar to step 1005 described above with reference to FIG. 10, and the description is not repeated herein.

In step 1107, the precursor material is subjected to the EM radiation 121 from the EM radiation sources 119. In some embodiments, the EM radiation 121 decomposes the precursor material into various components. In some embodiments, step 1107 is similar to step 309 described above with reference to FIG. 3, and the description is not repeated herein.

In step 1109, a layer (such as the deposited layer 201) is deposited over the substrate 200. In some embodiments, decomposed precursor components react with each other to form the deposited layer 201 over the substrate 200. In some embodiments, the deposition method 1100 is performed at a temperature between about 50° C. and 400° C. In some embodiments, the heating mechanisms 109 of the mounting platform 107 are used to heat the substrate 200 to a desired temperature.

In step 1111, the EM radiation 609 from the EM radiation sources 601 is used to burn cluster defects 615 form in the deposited layer 201 at the edge of the substrate 200. In some embodiments, step 1111 is similar to step 711 described above with reference to FIG. 7, and the description is not repeated herein.

Figure 12:
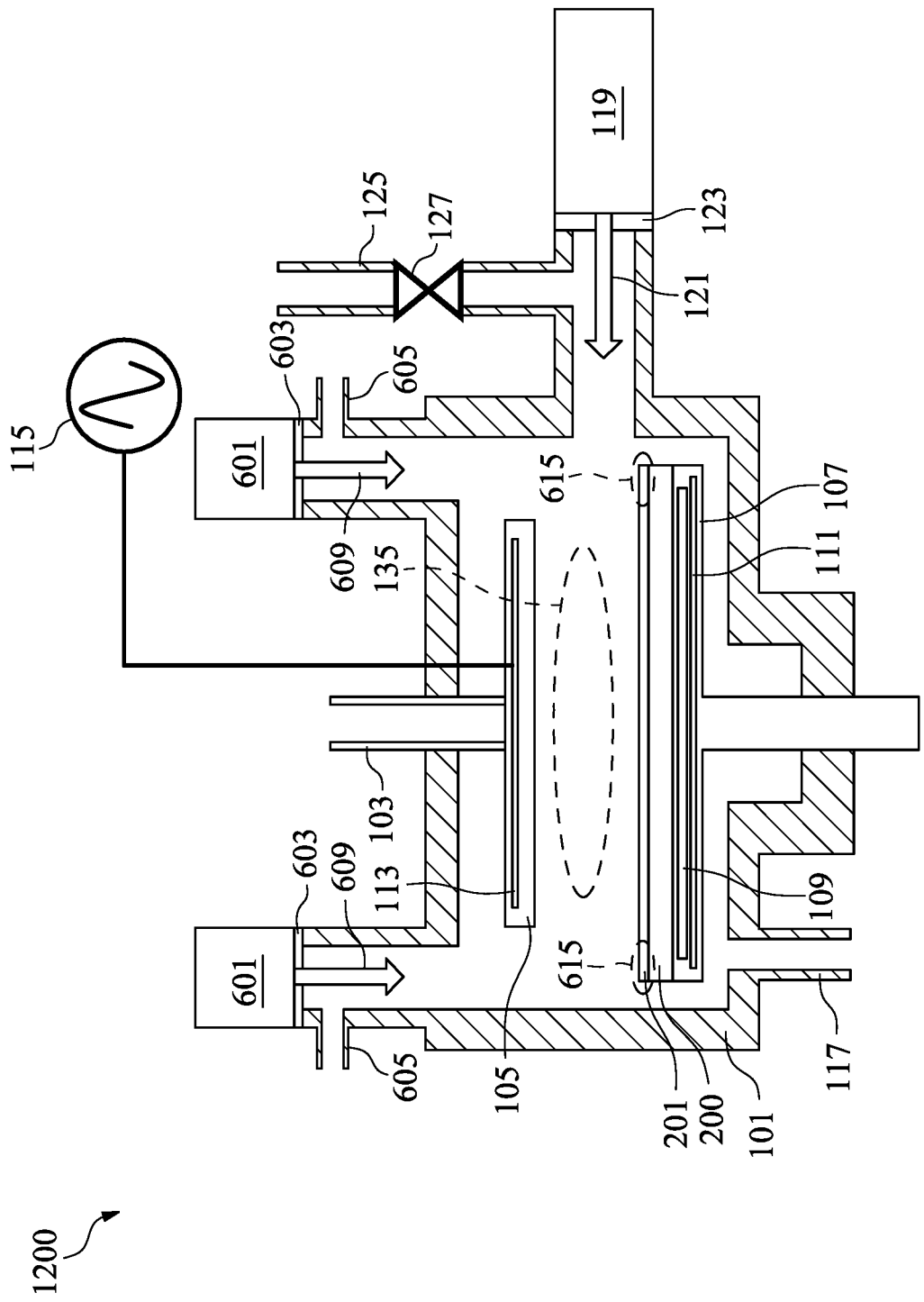
FIG. 12 illustrates a cross-sectional view of a deposition system in accordance with some embodiments.

FIG. 12 illustrate a cross-sectional view of a deposition system 1200 in accordance with some embodiments. The deposition system 1200 is similar to the deposition system 900 (see FIG. 9), with like features being labeled by like numerical references, and descriptions of the like features are not repeated herein. In distinction with the deposition system 900, the deposition system 1200 comprises a single EM radiation source 119. In some embodiments, the deposition methods 1000 and 1100 may be performed using the deposition system 1200.

Embodiments may achieve advantages. Various embodiments discussed herein allow for depositing void-free and seam free layers with reduced impurity and defect levels, and providing additional parameters (such as, for example, EM radiation intensity and/or wavelength) for tuning the deposition process (for example, tuning a composition of the deposited layer).

In accordance with an embodiment, a method includes placing a substrate over a platform in a chamber of a deposition system. A precursor material is introduced into the chamber. A first gas curtain is generated in front of a first electromagnetic (EM) radiation source coupled to the chamber. A plasma is generated from the precursor material in the chamber, wherein the plasma comprises dissociated components of the precursor material. The plasma is subjected to a first EM radiation from the first EM radiation source. The first EM radiation further dissociates the precursor material. A layer is deposited over the substrate. The layer includes a reaction product of the dissociated components of the precursor material. In an embodiment, generating the first gas curtain in front of the first EM radiation source includes flowing an inert gas into the chamber in front of the first EM radiation source. In an embodiment, the first EM radiation source is an ultraviolet (UV) source or a laser source. In an embodiment, the method further includes generating a second gas curtain in front of a second EM radiation source coupled to the chamber. In an embodiment, the method further includes burning, using a second EM radiation from the second EM radiation source, cluster defects in the layer at an edge of the substrate, where the second EM radiation source is directly over the edge of the substrate. In an embodiment, the method further includes adjusting a temperature of the substrate to a desired temperature. In an embodiment, the first EM radiation enters into the chamber through a window, the window including a material transparent to the first EM radiation. In an embodiment, the precursor material includes $SiH_4$, $Si_2H_6$, $SiCl_2H_2$, $SiCl_4$, or $Si_2Cl_6$, and the layer includes amorphous silicon (a-Si).

In accordance with another embodiment, a method includes placing a substrate over a platform in a chamber of a deposition system. A precursor material is flown into the chamber. A first gas curtain is generated in front of a first electromagnetic (EM) radiation source coupled to the chamber. A plasma is generated from the precursor material in the chamber. The plasma includes dissociated components of the precursor material. A layer is deposited over the substrate. The layer includes a reaction product of the dissociated components of the precursor material. The layer includes cluster defects at an edge of the substrate. Using a first EM radiation from the first EM radiation source, the cluster defects are removed from the layer. In an embodiment, generating the first gas curtain in front of the first EM radiation source includes flowing an inert gas into the chamber in front of the first EM radiation source. In an embodiment, the first EM radiation source is an ultraviolet (UV) source or a laser source. In an embodiment, the method further includes generating a second gas curtain in front of a second EM radiation source coupled to the chamber. In an embodiment, the method further includes, before depositing the layer over the substrate, subjecting the plasma to a second EM radiation from the second EM radiation source, where the second EM radiation further dissociates the precursor material. In an embodiment, the first EM radiation burns the cluster defects. In an embodiment, first EM radiation source overlaps with an edge of the platform in a plan view.

In accordance with yet another embodiment, a system includes a chamber, a side of the chamber having a first window; a platform in the chamber, the platform including a first electrode; a showerhead over the platform in the chamber, the showerhead including a second electrode; a plasma power source coupled to the second electrode; and a first electromagnetic (EM) radiation source attached to the side of the chamber. A first EM radiation generated by the first EM radiation source enters into the chamber through the first window and propagates between the platform and the showerhead. In an embodiment, the system further includes second EM radiation sources attached to a top of the chamber, second EM radiations generated by the second EM radiation sources entering into the chamber through second windows in the top of the chamber. In an embodiment, the second EM radiation sources are placed along an edge of the platform in a plan view. In an embodiment, the second EM radiation sources have a uniform spacing. In an embodiment, the first EM radiation source is an ultraviolet (UV) source or a laser source.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
placing a substrate over a platform in a chamber of a deposition system;
introducing a precursor material into the chamber;
after introducing the precursor material, flowing a first inert gas to generate a first gas curtain in front of a first electromagnetic (EM) radiation source coupled to the chamber, and to generate a second gas curtain in front of a second EM radiation source coupled to the chamber;
after flowing the first inert gas, generating a plasma from the precursor material in the chamber, wherein the plasma comprises dissociated components of the precursor material;
subjecting the plasma to a first EM radiation from the first EM radiation source and a second EM radiation from the second EM radiation source, wherein the first EM radiation and the second EM radiation further dissociates the precursor material, wherein the first EM radiation source provides the first EM radiation into the chamber through a window, wherein the first gas curtain provides a barrier between the precursor material and the window, wherein the first EM radiation and the second EM radiation propagate in opposite directions;
depositing a layer over the substrate, the layer comprising a reaction product of the dissociated components of the precursor material; and
burning, using a third EM radiation from a third EM radiation source coupled to the chamber, and using a fourth EM radiation from a fourth EM radiation source coupled to the chamber, cluster defects in the layer at an outer perimeter of the substrate, wherein the third EM radiation source and the fourth EM radiation source overlap the outer perimeter of the substrate, wherein the third EM radiation source is adjacent to the fourth EM radiation source, and wherein a spacing between the third EM radiation source and the fourth EM radiation source is in a range between 50 mm and 200 mm.

2. The method of claim 1, wherein the first EM radiation source is an ultraviolet (UV) source or a laser source.

3. The method of claim 1, further comprising generating a third gas curtain in front of the third EM radiation source, and generating a fourth gas curtain in front of the fourth EM radiation source.

4. The method of claim 1, further comprising adjusting a temperature of the substrate to a desired temperature.

5. The method of claim 1, wherein the first EM radiation enters into the chamber through a window, the window comprising a material transparent to the first EM radiation.

6. The method of claim 1, wherein the precursor material comprises $SiH_4$, $Si_2H_6$, $SiCl_2H_2$, $SiCl_4$, or $Si_2Cl_6$, and wherein the layer comprises amorphous silicon (a-Si).

7. The method of claim 1, wherein an energy of the first EM radiation and the second EM radiation is lower than an energy of the third EM radiation and the fourth EM radiation.

8. The method of claim 1, wherein the third EM radiation source is an ultraviolet (UV) source or a laser source.

9. A method comprising:
placing a substrate over a platform in a chamber of a deposition system;
flowing a precursor material into the chamber using a showerhead;
generating a first gas curtain in front of a first electromagnetic (EM) radiation source coupled to the chamber, and a second gas curtain in front of a second EM radiation source coupled to the chamber, wherein the first EM radiation source is separated from the chamber by a window, and wherein the first gas curtain protects the window from the precursor material, wherein generating the first gas curtain is initiated after flowing the precursor material into the chamber;
generating a third gas curtain in front of a third EM radiation source coupled to the chamber, and a fourth gas curtain in front of a fourth EM radiation source coupled to the chamber, wherein the third EM radiation source is separated from the chamber by a window, wherein generating the third gas curtain is initiated after flowing the precursor material into the chamber, wherein the third EM radiation source and the fourth EM radiation source overlap with an outer perimeter of the substrate in a plan view, and wherein the third EM radiation source is disposed above the showerhead;
after generating the first gas curtain, generating a plasma from the precursor material in the chamber, wherein the plasma comprises dissociated components of the precursor material;
subjecting the plasma to a first EM radiation from the first EM radiation source and a second EM radiation from the second EM radiation source, wherein the first EM radiation and the second EM radiation propagate in opposite directions;
depositing a layer over the substrate, the layer comprising a reaction product of the dissociated components of the precursor material, the layer comprising cluster defects at the outer perimeter of the substrate; and
removing, using a third EM radiation from the third EM radiation source and a fourth EM radiation from the fourth EM radiation source, the cluster defects from the layer at the outer perimeter of the substrate, wherein a spacing between the third EM radiation source and the fourth EM radiation source is in a range between 50 mm and 200 mm.

10. The method of claim 9, wherein generating the first gas curtain in front of the first EM radiation source comprises flowing a first inert gas into the chamber in front of the first EM radiation source.

11. The method of claim 9, wherein the first EM radiation source is an ultraviolet (UV) source or a laser source.

12. The method of claim 9, wherein generating the second gas curtain in front of the second EM radiation source comprises flowing a second inert gas into the chamber in front of the second EM radiation source.

13. The method of claim 12, wherein during subjecting the plasma to the first EM radiation from the first EM radiation source, the first EM radiation further dissociates the precursor material.

14. The method of claim 9, wherein the third EM radiation burns the cluster defects.

15. A method comprising:
placing a substrate over a platform in a chamber of a deposition system;
flowing a precursor material into the chamber;
generating a first gas curtain of a first inert gas in front of a first laser source coupled to the chamber, and a second gas curtain of a second inert gas in front of a second laser source coupled to the chamber, wherein generating the first gas curtain begins after flowing the precursor material into the chamber;
generating a third gas curtain of a third inert gas in front of a third laser source coupled to the chamber, and a fourth gas curtain of a fourth inert gas in front of a fourth laser source coupled to the chamber, wherein generating the third gas curtain begins after flowing the precursor material into the chamber;
after generating the first gas curtain and the second gas curtain, generating a plasma from the precursor material in the chamber, wherein the plasma comprises dissociated components of the precursor material;
subjecting the plasma to a first electromagnetic (EM) radiation from the first laser source, and a second EM radiation from the second laser source, wherein the first EM radiation and the second EM radiation further dissociates the precursor material, wherein the first laser source provides the first EM radiation through a first window, and wherein the first EM radiation and the second EM radiation propagate in opposite directions;
depositing a layer over the substrate using the further dissociated precursor material, wherein depositing the layer forms cluster defects; and
burning, using a third EM radiation from the third laser source and a fourth EM radiation from the fourth laser source, the cluster defects, wherein the third laser source and the fourth laser source overlap an outer perimeter of the substrate, and wherein a spacing between the third laser source and the fourth laser source is in a range between 50 mm and 200 mm.

16. The method of claim 15, wherein the third laser source is one of a plurality of laser sources, wherein the plurality of laser sources are arranged in a circular pattern to overlap the outer perimeter of the substrate in a plan view, and wherein the method comprises:
burning, using EM radiation from each of the plurality of laser sources, the cluster defects.

17. The method of claim 15, wherein the first laser source is separated from the chamber by the first window, and wherein the first gas curtain protects the first window from the precursor material.

18. The method of claim 17, wherein the second laser source is separated from the chamber by a second window, and wherein the second gas curtain protects the second window from the precursor material.

19. The method of claim 15, wherein depositing the layer over the substrate is performed at a process temperature that is in a range from 50° C. to 400° C.

* * * * *